(12) United States Patent
Johansson et al.

(10) Patent No.: US 6,198,156 B1
(45) Date of Patent: Mar. 6, 2001

(54) BIPOLAR POWER TRANSISTORS AND MANUFACTURING METHOD

(75) Inventors: Ted Johansson, Djursholm; Bengt Torkel Arnborg, Stockholm, both of (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/141,537

(22) Filed: Aug. 28, 1998

(30) Foreign Application Priority Data

Aug. 29, 1997 (SE) .................................................. 9703129

(51) Int. Cl.[7] ...................... H01L 27/082; H01L 27/102; H01L 29/70
(52) U.S. Cl. ........................... 257/593; 257/565; 257/585
(58) Field of Search ..................................... 257/583, 585, 257/565

(56) References Cited

U.S. PATENT DOCUMENTS

| | | |
|---|---|---|
| 5,071,778 | 12/1991 | Solheim . |
| 5,237,200 * | 8/1993 | Namba et al. ........................ 257/565 |
| 5,270,223 * | 12/1993 | Liu ......................................... 257/197 |
| 5,488,252 | 1/1996 | Johansson et al. . |
| 5,986,326 * | 11/1999 | Kato ..................................... 257/593 |

FOREIGN PATENT DOCUMENTS

0762511 * 3/1997 (EP) .

OTHER PUBLICATIONS

W. P. Dumke, "Transistor Collector Doping for Reduced Capacitance," IBM Technical Disclosure Bulletin, vol. 26, No. 2, Jul. 1983, p. 492.

The Penguin Dictionary of Electronics, Second Edition, V. Illingworth, pp. 185–186, 1988.*

* cited by examiner

Primary Examiner—Matthew Smith
Assistant Examiner—Granvill D. Lee
(74) Attorney, Agent, or Firm—Burns, Doane, Swecker & Mathis, L.L.P.

(57) ABSTRACT

A bipolar power transistor intended for radio frequency applications, especially for use in an amplifier stage in a radio base station, and a method for manufacturing the bipolar power transistor are provided. The power transistor includes a substrate (13), an epitaxial collector layer (15) on the substrate (13), a base (19) and an emitter (21) formed in the collector layer (15). The degree of doping $N_c(x)$ of the collector layer varies from its upper surface (24) and downwards to at least half the depth of the collector layer, essentially according to a polynom of at least the second degree, $a_0 + a_1 x + a_2 x^2 + \ldots$, where $a_0$ is the degree of doping at the upper surface (24), x is the vertical distance from the same surface (24) and $a_1, a_2, \ldots$ are constants. The transistor can further include an at least approximately $2\mu$ thick insulation oxide (17) between the epitaxial collector layer (15) and higher situated metallic connections layers (31, 33).

15 Claims, 1 Drawing Sheet

BIPOLAR POWER TRANSISTORS AND MANUFACTURING METHOD

TECHNICAL FIELD

The present invention relates to a vertical bipolar power transistor intended for radio frequency applications, especially for use in an amplifier stage in a radio base station, and a method for manufacturing the bipolar power transistor.

STATE OF THE ART

Bipolar transistors for power amplification at high frequencies must comply with a number of detail requirements concerning power amplification, robustness, breakdown voltage, noise, distortion, capacitances, input and output impedances, etc., at a specified supply voltage and operating frequency. The operating frequencies for modern telecommunication electronics can vary in the radio and microwave region. The requirements for the output power varies from some few watts to several hundred watts, where in the latter case several parallel connected components in a capsule are used. Power transistors work with high signal levels and high current densities. Computer tools which exist today are not capable in a detailed manner of simulating the behaviour or performance in practical applications.

The semiconductor material which is most used for power transistors, at least at frequencies under 3 GHz, is silicon. Furthermore, depending on the high mobility of the electrons in comparison with holes, power transistors of the npn-type are used principally. The transistor structure is normally vertical with the contact of the collector on the backside of the silicon substrate. A collector layer is epitaxially deposited on the substrate. The base and the emitter are formed through diffusion or ion implantation from above in the epitaxial layer. By varying the degree of doping in the collector, base and/or the emitter, it is possible to obtain different types of frequency and breakdown voltage characteristics. Different horizontal geometries give transistors with different current capacities.

Distortion occurs when the size of the output signal is not exactly proportional to the input signal. Active semiconductor arrangements, such as bipolar transistors and field effect transistors will always produce a non-linear output signal depending on the non-linear input/output characteristics, and during coupling at high frequencies also internal and external parasitic elements. Non-linearities in a bipolar arrangement are more complex than those in a field effect transistor because of the exponential input/output relationship of the former.

The linearity or the absence of distortion of the output transistor determines important parameters for communication systems such as, for example, interference with adjacent channels and therefore consequently the frequency margin which is necessary between adjacent channels.

The fundamental non-linear relationship between the input and the output signals of a bipolar power transistor cannot be reduced without changing the shape or material of the transistor. A reduction of parasitic elements such as capacitances is, however, easier to achieve, whereby the most important should be those on the output of the transistor, which in the main are formed from the capacitance of the base collector and the parasitic metal-substrate capacitances.

It is known from W. P. Dumke, "Transistor Collector Doping for Reduced Capacitance", IBM Technical Disclosure Bulletin, Vol. 26, No. 2, July 1983 to reduce the base collector capacitance of bipolar high-speed transistors of the npn-type through producing a varying doping profile on the epitaxial collector. The donor concentration $N_{D,C}$ varies from $10^{19}$–$10^{18}$ lowest down towards the substrate to $10^{16}$ inside the epitaxial layer and then increases again to be closer to $10^{17}$ at the surface adjacent to the base.

DISCLOSURE OF THE INVENTION

The object of the present invention is to provide a vertical bipolar power transistor which comprises a substrate, an epitaxial collector layer on the substrate, a base and an emitter formed in the epitaxial layer, with higher performance, in particular an improved linearity.

This is achieved by reducing the dC/dV-value and thereby the so-called C(V)-swing. Such a reduction is achieved by doping the power transistor collector in such a way that the resulting doping profile $N_c$ is greatly dependent on the depth x of the collector, i.e. $N_c=N_c(x)$.

In more detail the degree of doping $N_c(x)$ of the epitaxial collector layer varies from the surface adjacent to the base and downwardly to at least half the depth of the collector layer, essentially according to a polynomial of at least the second degree, $a_0+a_1x+a_2x^2+\ldots$, where $a_0$ is the degree of doping at the surface adjacent to the base, x is the vertical distance from the same surface and $a_1, a_2, \ldots$ are constants. Preferably, the degree of doping varies according to $a_0+a_nx^n$, where $n>>1$ or according to $a_0e^{Bx}$, where B is a constant.

The transistor further comprises preferably a thick insulating oxide between the epitaxial collector layer and the higher situated metallic connecting layers.

According to a manufacturing method for the bipolar transistor according to the invention, the epitaxial collector layer is doped by doping substances being supplied according to a reduced extent during deposition of the epitaxial collector layer. Alternatively, the epitaxial collector layer is deposited as a multilayer structure where each and all of the constituent layers have a constant degree of doping, whereafter the epitaxial layer is heat-treated in such a way that the resulting doping profile becomes essentially smooth. The constituent layers in the multilayer structure can be deposited with a constant thickness and a non-linearly diminishing degree of doping, or with an increasing thickness and a linearly diminishing degree of doping.

According to another method, the epitaxial collector layer is doped with a constant degree of doping, whereafter so-called counter doping takes place by implanting ions of the opposite conductivity type through the upper surface of the epitaxial collector layer followed by driving-in through heat treatment. An advantage of the invention is that the linearity of the power transistor is considerably improved when the transistor collector is doped by a method according to the invention. Other performances, such as for example breakdown voltage, upper boundary frequency and amplification can furthermore be improved by suitably chosen numerical values of the doping profile.

The performance of the power transistor is further improved when a thick field oxide is used. The base metal-collector capacitance is reduced in this case.

DESCRIPTION OF THE FIGURES

The invention is described more closely below with reference to the appended drawing, which is only shown to illustrate the invention, and which therefore cannot in any way limit the invention.

FIG. 1b shows a doping profile, i.e. the degree of doping as a function of depth, of the bipolar power transistor shown in FIG. 1a.

PREFERRED EMBODIMENTS

Figure 1A:
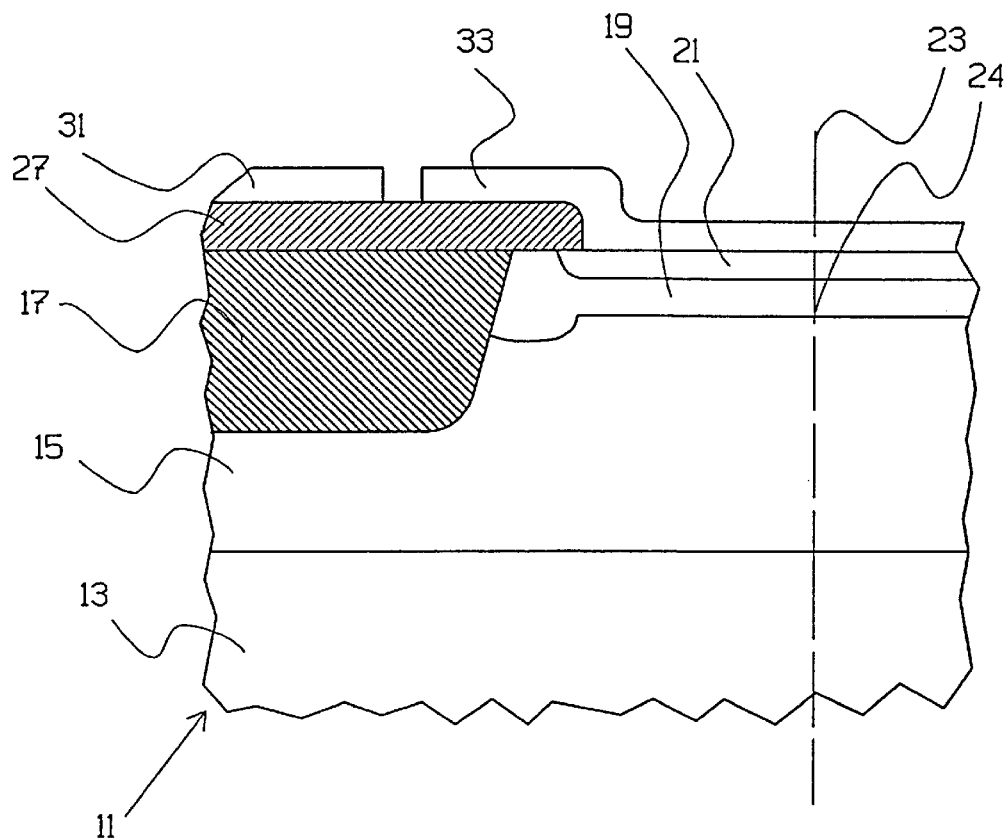
FIG. 1a shows in cross-section a detail of a vertical bipolar power transistor according to the invention, intended for high frequency applications.

In FIG. 1, 11 refers to a detail of a vertical bipolar power transistor according to the invention intended for high frequency applications. The power transistor comprises a substrate 13 upon which an epitaxial layer 15 is deposited. This layer 15, which preferably is n-doped, forms the whole or part of the power transistor collector. The substrate 13 can be n-doped and also form part of the collector, whereby collector contacts are produced on the underside of the substrate.

The substrate 13 can alternatively be p-doped or be of a semiconductor material, wherein a subcollector is produced between the substrate 13 and the epitaxial layer 15, and the collector contacts are produced on the upper side of the epitaxial layer. Such a so-called buried layer method is not shown in the figures.

In the epitaxial collector layer 15, a first p-doped region 19 which forms the base of the power transistor is formed adjacent to the upper surface of the collector layer. Further, a second n-doped region 21 adjacent to the upper surface of the collector layer is formed in the first region 19. This second region 21 forms the power transistor's emitter.

The base and the emitter of the power transistor can also be formed in separate layers (not shown in FIG. 1).

The power transistor can also, according to the invention, comprise an insulating oxide 17, an insulating layer 27 and metallic connection layers 31,33, which will be described more closely further on in the description.

The transition capacitance between the base 19 and the collector 15 is by nature non-linear. Thereby a number of non-linearities are generated in the frequency spectrum, i.a. overtones, when the voltage over the base collector transition changes. During switching of high signal strengths the voltage over the base collector transition varies between zero and double the supply voltage (typically 50–60 V), which gives a very large variation of the base collector capacitance.

By having a gradient in the doping profile of the collector the base collector capacitance variation dC/dV is reduced and in this way the linearity at high signal strength amplifications is improved. The degree of doping should be lowest at the surface 24 adjacent to the base 19 in order to then successively be increased towards the substrate 13.

According to the invention the degree of doping $N_c(x)$ of the epitaxial collector layer varies from the surface 24 adjacent to the base 19 and downwards to at least half the depth of the collector layer, essentially according to a polynom of at least the second degree $$N_c(x) = a_0 a_1 x + a_2 x^2 + \ldots$$

where $a_0$ is the degree of doping at the surface 24 adjacent to the base 19, x is the vertical distance from the same surface 24, and $a_1, a_2, \ldots$ are constants.

Advantageously the degree of doping of the collector layer can vary essentially according to $$N_c(x) = a_0 + a_n x^n$$

where $n \gg 1$.

The degree of doping c an also vary according to $$N_c(x) = a_0 e^{Bx}$$

where B is a constant.

Figure 1B:
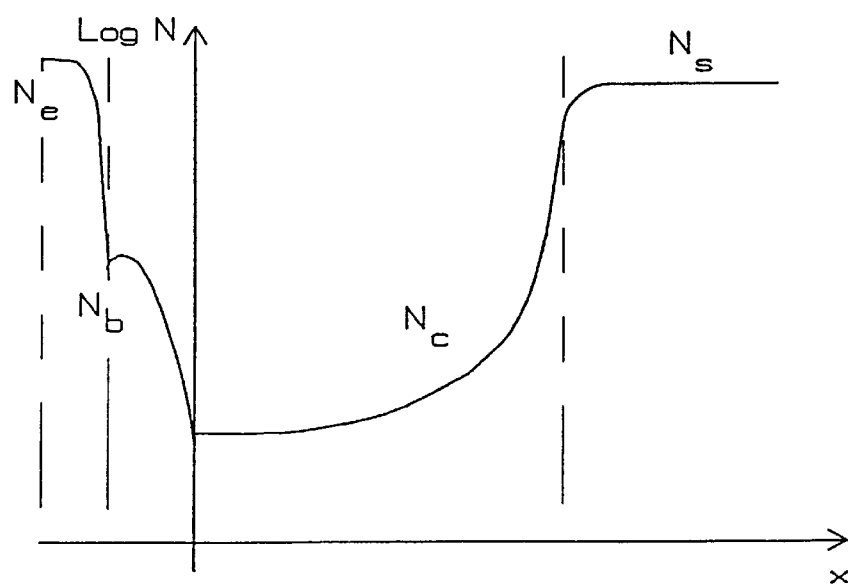

In FIG. 1b is shown the doping profile of the vertical bipolar power transistor in the depth direction according to the dashed line 23 in FIG. 1a. Herewith is indicated the doping profile $N_e$ of the emitter, the doping profile $N_b$ of the base, the doping profile $N_c$ of the collector and the degree of doping $N_s$ of the substrate. Note that the logarithm of the doping profile is shown, that x=0 at the base-collector transition 24 and that the depth of the emitter and the base is shown greatly exaggerated. Typical values for the depth are 0.3 $\mu$m for the emitter, 0.25 $\mu$m for the base and 6.0 $\mu$m for the collector.

The degree of doping $a_0$ at the upper surface 24 of the collector layer and the constants $a_1, a_2, a_3, \ldots, B$ are determined through consideration of other important parameters for the bipolar power transistor and to what is practically realizable. For example, a power transistor has been produced with $a_0 \approx 10^{14}$ cm$^{-3}$ and with a maximal degree of doping of approximately $2 \cdot 10^{15}$ cm$^{-3}$ at depths greater than approximately 4 $\mu$m.

In addition to linearity, other performances, concerning for example breakdown voltage, upper cut-off frequency and amplification, can be improved with suitably chosen numerical values for the doping profile of the epitaxial collector. If no account is taken of these parameters, there is a risk that the direct current and power performances become degraded and no total improvement is achieved. Some of these parameters are described in the following.

Emitter-collector breakdown voltage ($BV_{CEO}$) and base-collector breakdowm voltage ($BV_{CBO}$). For a power transistor for high-frequency applications, the breakdown voltage $BV_{CEO}$ is the limiting parameter. $BV_{CEO}$ is advantageously larger than the supply voltage and occurs, in general, approximately 1 $\mu$m under the collector surface 24. $BV_{CBO}$ must be greater than twice the supply voltage and occurs in general 4–6 $\mu$m under the collector surface 24. $BV_{CBO}$ and $BV_{CEO}$ are empirically related to each other ($BV_{CEO}$ is proportional to $BV_{CBO}$). $BV_{CEO}$ can also through doping in the whole of the collector layer be reduced (a large influence) or through the so-called beta-value being reduced (a small influence). A reduced doping causes i.a. the $BV_{CBO}$ to increase, the base push-out to increase (see below) and the ohmic losses in the collector layer to increase. Simulations and experiments have shown that the shallower parts of the epitaxial collector layer 15 advantageously can have a lower degree of doping (whereby $BV_{CEO}$ i s improved) without changing $BV_{CBO}$ or making base push-out worse.

Base push-out. At high current the deeper parts of the epitaxial collector layer 15 are responsible for push-out occurring. This push-out decreases with an increase of the degree of doping in the deeper part of the epitaxial layer 15. The so-called beta-value can increase under the same conditions, which however is not critical for the actual applications.

Signal amplification and cut-off frequency $f_T$. These are generally limited by the characteristics of the base. However, if the base push-out decreases at high current levels, the signal amplification and $f_T$ will be improved, which gives a higher saturated output power.

Manufacturing of a power transistor according to the invention with varying degrees of doping can take place in accordance with generally two different methods: adding of the doping substances to a varying degree during deposition of the epitaxial collector layer 15, and counter-doping. The methods are described below.

According to the first manufacturing method, the doping substances are added in a non-linear diminishing extent during the process when the epitaxial layer 15 is growing. The lowest degree of doping is obtained at the surface 24 and the gradient of the doping profile must be essentially smooth. Alternatively, an epitaxial layer 15 is made which consists of several layers of different thickness and/or degree of doping, where each layer has a homogeneous doping profile. Preferably the layers are deposited with a constant thickness and a non-linearly decreasing degree of doping or with an increasing thickness and a linearly diminishing degree of doping. As the process flow comprises several later occurring heating stages, the discrete doping profile of the epitaxial layer will transform into a smooth continuous doping profile in the finished power transistor. This method offers a high flexibility but is probably not applicable for large volume production.

According to the second manufacturing method, doping substances of the opposite conductivity type are added to a homogeneously doped epitaxial collector layer 15. If, for example, the collector layer is n-doped, one or several ion implantations of p-type are performed through the upper surface of the collector layer, whereafter driving in takes place through heat treatment. In this case the gradient of the doping profile becomes essentially smooth and the lowest effective degree of doping is obtained at the surface 24. It is relatively simple to implement in a normal process flow but does not give much flexibility.

Further steps which can be taken to reduce the base collector capacitance are, according to the invention, to use thick insulation oxides 17.

The base 19 resp. the emitter 21 are electrically connected to a first resp. a second metallic connection layer 31,33. In the cross-section of FIG. 1a only the emitter's connection to the connection layer 33 is shown. The power transistor in the lateral direction can have a so-called interdigitated structure, for example, as described in U.S. Pat. No. 5,488,252.

The metallic connection layers 31,33 are at least partially separated from the epitaxial layer 15 by an insulation oxide 17. The power transistor can furthermore comprise an insulating layer 27 partially over the insulation oxide 17. Through using a thick insulation oxide 17, preferably of a thickness of at least approximately 2 $\mu$m, during the metallization, the performance of the power transistor is considerably improved.

A vertical bipolar power transistor according to the present invention is reliable and has a high performance, especially a low distortion.

Through doping the epitaxial collector layer according to $N_c = a_0 + a_1 x + a_2 x^2 + \ldots$, where $a_0$ is the doping degree at the surface adjacent to the base, x is the vertical distance from said surface, and $a_1, a_2, \ldots$ are constants, especially according to $N_c = a_0 + a_n x^m$, n>>1, the C(V)-swing is reduced and the linearity of the power transistor during switching of large signals is improved extremely considerably.

Through using an insulation oxide of large thickness, at least approximately 2 $\mu$m, the performance of the power transistor is considerably improved. Through having an extremely high degree of doping in the deeper parts of the epitaxial layer of the collector, a number of parameters can be changed in such a way that the total performance of the transistor is improved.

The invention is naturally not limited to the embodiment described above and shown in the drawing, but can be modified within the scope of the accompanying claims. In particular, the invention is not limited by materials, geometries or dimensions. The invention is, for example, realizable in silicon as well as in mixed semiconductors, for example III–V-semiconductors such as gallium arsenide. Furthermore, the bipolar power transistor can be of pnp-type.

What is claimed is:

1. Vertical bipolar power transistor, principally intended for radio frequency applications, especially for use in an amplifier stage in a radio base station, comprising:
   a substrate of a first conductivity type;
   a collector layer of the first conductivity type provided on the substrate;
   a first region of a second conductivity type adjacent to an upper surface of the collector layer; and
   a second region of said first conductivity type adjacent to the first region,
   wherein a degree of doping $N_c(x)$ of the collector layer varies from said upper surface and downwards to at least half a depth of the collector layer according to a polynom of at least a second degree of, $$N_c = a_0 + a_1 x + a_2 x^2,$$

where $a_0$ is the degree of doping at the upper surface, x is a vertical distance from the upper surface, and $a_1, a_2$, are predetermined constants.

2. Vertical bipolar power transistor according to claim 1, wherein the degree of doping $N_c(x)$ of the collector layer varies according to $N_c = a_0 + a_n x^n$, where n>>1.

3. Vertical bipolar power transistor according to claim 1, wherein the degree of doping $N_c(x)$ of the collector layer varies according to $N_c = a_0 e^{Bx}$, where B is a constant.

4. Vertical bipolar power transistor according to claim 1, wherein the first and the second regions are electrically connected to first and second metallic connection layers and that these metallic connection layers at least partially are separated from the epitaxial layer by a thick insulation oxide.

5. Vertical bipolar power transistor according to claim 1, wherein the collector layer consists of silicon.

6. Vertical bipolar power transistor according to claim 1, wherein the collector layer consists of a mixed semiconductor, especially gallium arsenide.

7. Method for the manufacturing of a vertical bipolar power transistor principally intended for radio frequency applications, especially for use in an amplifier stage in a radio base station, comprising the steps of:
   forming a substrate of a first conductivity type;
   providing a collector layer of the first conductivity type on the substrate;
   providing a first region of a second conductivity type adjacent to an upper surface of the collector layer;
   providing a second region of said first conductivity type adjacent to the first region; and
   doping the collector layer in such a way that its degree of doping ($N_c(x)$) varies from the upper surface and downwards to at least half a depth of the collector layer according to a polynom of at least a second degree of,
   $N_c = a_0 + a_1 x + a_2 x^2$, where $a_0$ is the degree of doping at the upper surface, x is a vertical distance from the upper surface, and $a_1, a_2$ are predetermined constants.

8. Method according to claim 7, further comprising the step of doping the collector layer in such a way that its degree of doping ($N_c(x)$) varies according to $N_c = a_0 + a_n x^n$, where n>>1.

9. Method according to claim 7, further comprising the step of doping the collector layer in such a way that its degree of doping ($N_c(x)$) varies according to $N_c = a_0 e^{Bx}$, where B is a constant.

10. Method according to claim 7, further comprising the step of doping the collector layer through doping substances being supplied according to a reduced extent during deposition of the collector layer.

11. Method according to claim 7, further comprising the step of depositing the collector layer as a multilayer structure where each and all of the constituent layers have a constant degree of doping and that the collector layer is heat-treated in such a way that the resulting doping profile ($N_c(x)$) becomes essentially smooth.

12. Method according to claim 11, further comprising the step of depositing the constituent layers in the multilayer structure with a constant thickness and a non-linearly diminishing degree of doping.

13. Method according to claim 11, further comprising the step of depositing the constituent layers in the multilayer structure with an increasing thickness.

14. Method according to claim 7, further comprising the steps of first doping the collector layer to a constant degree of doping, thereafter adding doping substances of a second conductivity type, and whereafter heat-treating the obtained structure.

15. Method according to claim 7, further comprising the steps of providing at least 2 $\mu$m thick insulation oxide in or over the collector layer, providing first and second metallic connection layers at least partially over the insulation oxide and connecting electrically to the first and the second regions.

* * * * *